United States Patent
Yang et al.

(10) Patent No.: US 8,421,496 B2
(45) Date of Patent: Apr. 16, 2013

(54) DIGITAL LOGIC CIRCUIT AND MANUFACTURE METHOD THEREOF

(75) Inventors: Ching-Jung Yang, Hsinchu (TW); Tsung-Ju Yu, Hsinchu County (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 13/118,267

(22) Filed: May 27, 2011

(65) Prior Publication Data

US 2011/0291697 A1 Dec. 1, 2011

(30) Foreign Application Priority Data

May 28, 2010 (TW) ................................. 99117162 A

(51) Int. Cl.
*H03K 19/003* (2006.01)
*H01K 43/00* (2006.01)

(52) U.S. Cl.
USPC .................................. 326/21; 326/68; 326/83

(58) Field of Classification Search .................. None
See application file for complete search history.

(56) References Cited

U.S. PATENT DOCUMENTS

| 5,910,730 A * | 6/1999 | Sigal ............................... 326/24 |
| 6,084,452 A * | 7/2000 | Drost et al. .................... 327/175 |
| 2006/0143586 A1 * | 6/2006 | Suaya et al. ..................... 716/13 |
| 2010/0123995 A1 * | 5/2010 | Otsuka et al. .............. 361/308.1 |

* cited by examiner

*Primary Examiner* — Crystal L Hammond

(57) ABSTRACT

A digital logic circuit and a manufacture method of the digital logic circuit thereof are provided. The digital logic circuit includes a voltage rail, a ground rail, and a plurality of logic circuit rails, wherein each of the logic circuit rails is electrically connected to the voltage rail and the ground rail. The logic circuit rail includes a logic unit and an auxiliary unit electrically connected to the voltage rail and the ground rail. The logic unit includes a logic voltage end electrically connected to the voltage rail and a logic ground end electrically connected to the ground rail. The auxiliary unit includes an auxiliary voltage end electrically connected to the voltage rail and an auxiliary ground end electrically connected to the ground rail. At least one of the width ratio between the auxiliary voltage end and the logic voltage end and the width ratio between the auxiliary ground end and the logic ground end is greater than 1.

7 Claims, 5 Drawing Sheets

DIGITAL LOGIC CIRCUIT AND MANUFACTURE METHOD THEREOF

BACKGROUND OF THE INVENTION

1. Field of the Invention

This invention relates to a digital logic circuit, specifically to a digital logic circuit for use in an application-specific integrated circuit.

2. Description of the Prior Art

The progress in semiconductor technology allows computer systems to include more and more transistors without increase in size. In particular, computer systems originally disposed on a single circuit board referred as "System on Board" can now be accommodated on a single chip referred as "System on Chip" due to dimensional shrinkages of elements such as central processing units and memory components. Consequently, more and more System-on-Chip products are available on the market. Compared with systems disposed on circuit boards, systems accommodated in chips have the advantages of reduced costs, higher computing efficiency, and low power consumption and thus are becoming more and more popular. The smaller dimensions and lower costs allow System on Chips to be more versatile in potential uses, wherein System-on-Chips include application-specific integrated circuits (ASIC) that are tailored according to customer and electronic system requirements.

Application-specific integrated circuits (ASIC) have specific computing functions based on customer requirements. In the present semiconductor technology field, electronic design automation softwares are utilized to break up the application-specific integrated circuit (ASIC) into a plurality of logic elements with different logic functions such as AND, OR, XOR, or XNOR, wherein the electronic design automation software then arranges the logic elements in different places on the ASIC based on customer functionality requirements and size limitation of the application-specific integrated circuit.

FIG. 1 is a schematic view of an application-specific integrated circuit 10. The application-specific integrated circuit 10 includes a voltage rail 11, a ground rail 12, and a plurality of logic circuit rails 20, wherein the voltage rail 11 and the ground rail 12 are used to provide electrical signals. As FIG. 1 shows, the logic circuit rails 20 are electrically connected to the voltage rail 11 and the ground rail 12. The logic circuit rail 20 includes logic units 30 and auxiliary units 40 disposed next to each other. The logic units 30 are elements used to provide logic functions. Under the arrangement of electronic design automation software and under normal computing requirements, at least some logic circuit rails 20 consist of not only the logic units 30. Furthermore, the logic units 30 may be scattered over the logic circuit rail 20 due to design or circuitry requirements and therefore gaps may exist between the logic units 30.

The auxiliary units 40 illustrated in FIG. 1 are configured to fill the gaps between the logic units 30 and connect the logic units 30 to the voltage rail 11 and the ground rail 12. As FIG. 1 shows, the logic units 30 includes a logic voltage end 31 and a logic ground end 32 while the auxiliary unit 40 includes an auxiliary voltage end 41 and an auxiliary ground end 42. All the logic units 30 and the auxiliary units 40 are electrically connected to the voltage rail 11 via the logic voltage end 31 and the auxiliary voltage end 41, respectively. Similarly, the logic units 30 and the auxiliary units 40 are electrically connected respectively through the logic ground end 32 and the auxiliary ground end 42 to the ground rail 12 in order to establish an electrical loop with the voltage rail 11 and the ground rail 12 for electricity signal transmission.

However, the progress in semiconductor technology not only allows more and more transistors to be included in one logic unit 30, but also increase the number of logic units 30 in the application-specific integrated circuit 10. Consequently, connections between transistors are also becoming increasingly complex, which then cause the logic units 30 to increase in resistance, which in turn contributes to the increase in the overall resistance of the application-specific integrated circuit 10. The above-mentioned increase in resistance will influence the response time of the logic units 30 and thus the overall computing efficiency of the logic circuit rail 20. Furthermore, the width 50 of the logic voltage end 31 and the logic ground end 32 as well as their overall sizes are normally limited due to design choices. Therefore, how to reduce the overall resistance of the logic circuit rail 20 while maintaining the overall dimension of the logic unit 30 in a smaller scale is an important issue in the semiconductor technology.

SUMMARY OF THE INVENTION

It is an objective of the present invention to provide a digital logic circuit with reduced overall resistance and reduced response time.

It is another objective of the present invention to provide a manufacture method of digital logic circuit for reducing the resistances of the voltage rail and the ground rail of the digital logic circuit in order to reduce the response time of the digital logic circuit.

The digital logic circuit of the present invention includes a voltage rail, a ground rail, and a plurality of logic circuit rails located between the voltage rail and the ground rail, wherein the logic circuit rails are electrically connected to the voltage rail and the ground rail. The logic circuit rails include a logic unit and an auxiliary unit electrically connected to the voltage rail and the ground rail. The logic unit and the auxiliary unit include a logic voltage end and an auxiliary voltage end, respectively, wherein the logic voltage end and the auxiliary voltage end are connected in series and form a voltage conductor bar electrically connected to the voltage rail. Similarly, the logic unit and the auxiliary unit include a logic ground end and an auxiliary ground end, respectively, wherein the logic ground end and the auxiliary ground end are connected in series to form the ground conductor bar electrically connected to the ground rail. In this way, the logic unit can receive electrical power and signals from the voltage rail and the ground rail via the voltage conductor bar and the ground conductor bar.

The width of the auxiliary voltage end is greater than the width of the logic voltage end and the width of the auxiliary ground end is greater than the width of the logic ground end. In this way, the electrical conductors formed by the voltage end and the auxiliary voltage end as well as by the logic ground end and the auxiliary ground end have greater average cross-sectional area and smaller overall resistance, and therefore the overall digital logic circuit has faster response time and improved computing efficiency.

DETAILED DESCRIPTION OF THE PREFERRED EMBODIMENT

The present invention relates to a digital logic circuit and a method of manufacturing the digital logic circuit, wherein the present invention changes the overall resistance of the digital logic circuit and reduces the response time of the digital logic circuit by changing the width ratio between elements of the digital logic circuit.

Figure 1:
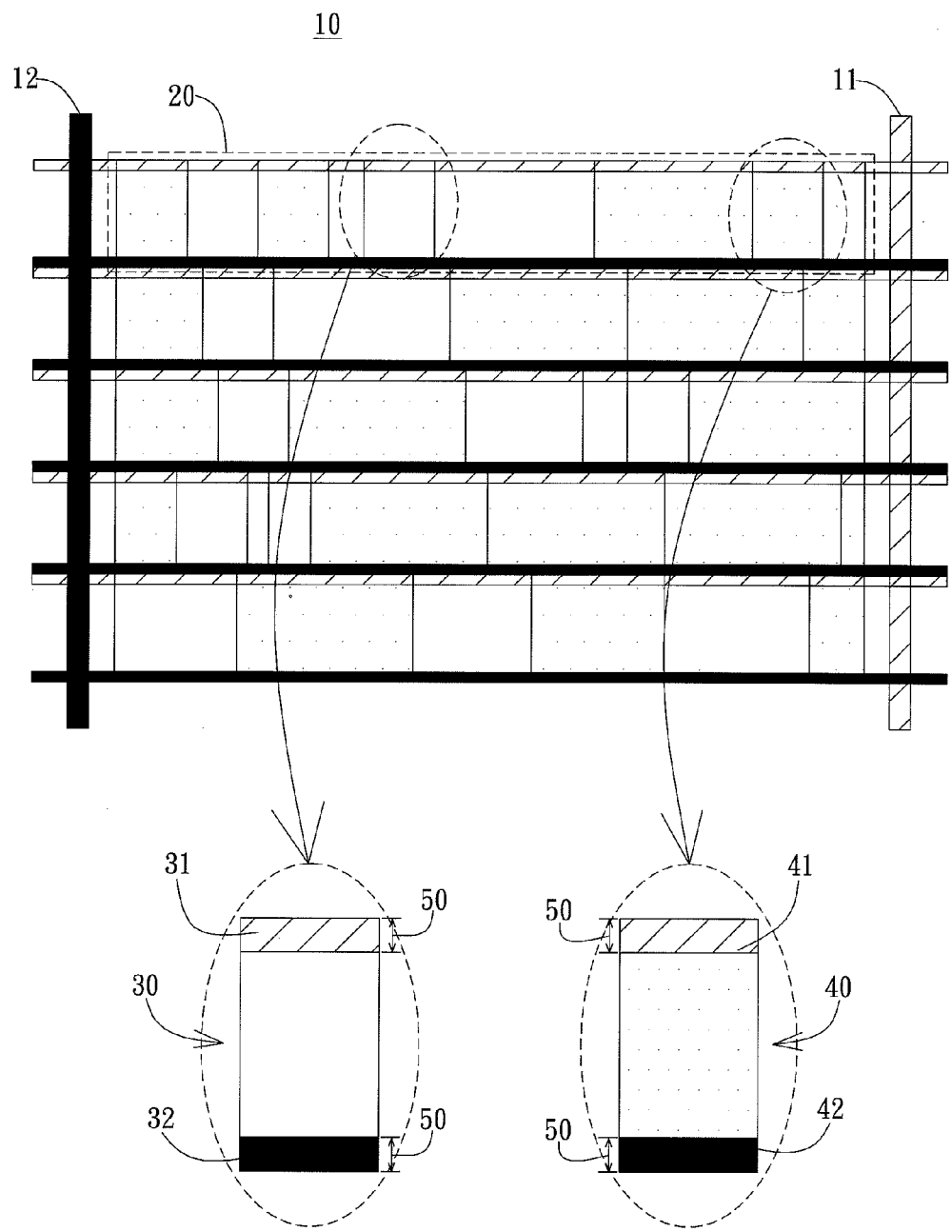
FIG. 1 is a schematic view of a conventional digital logic circuit.
Figure 2:
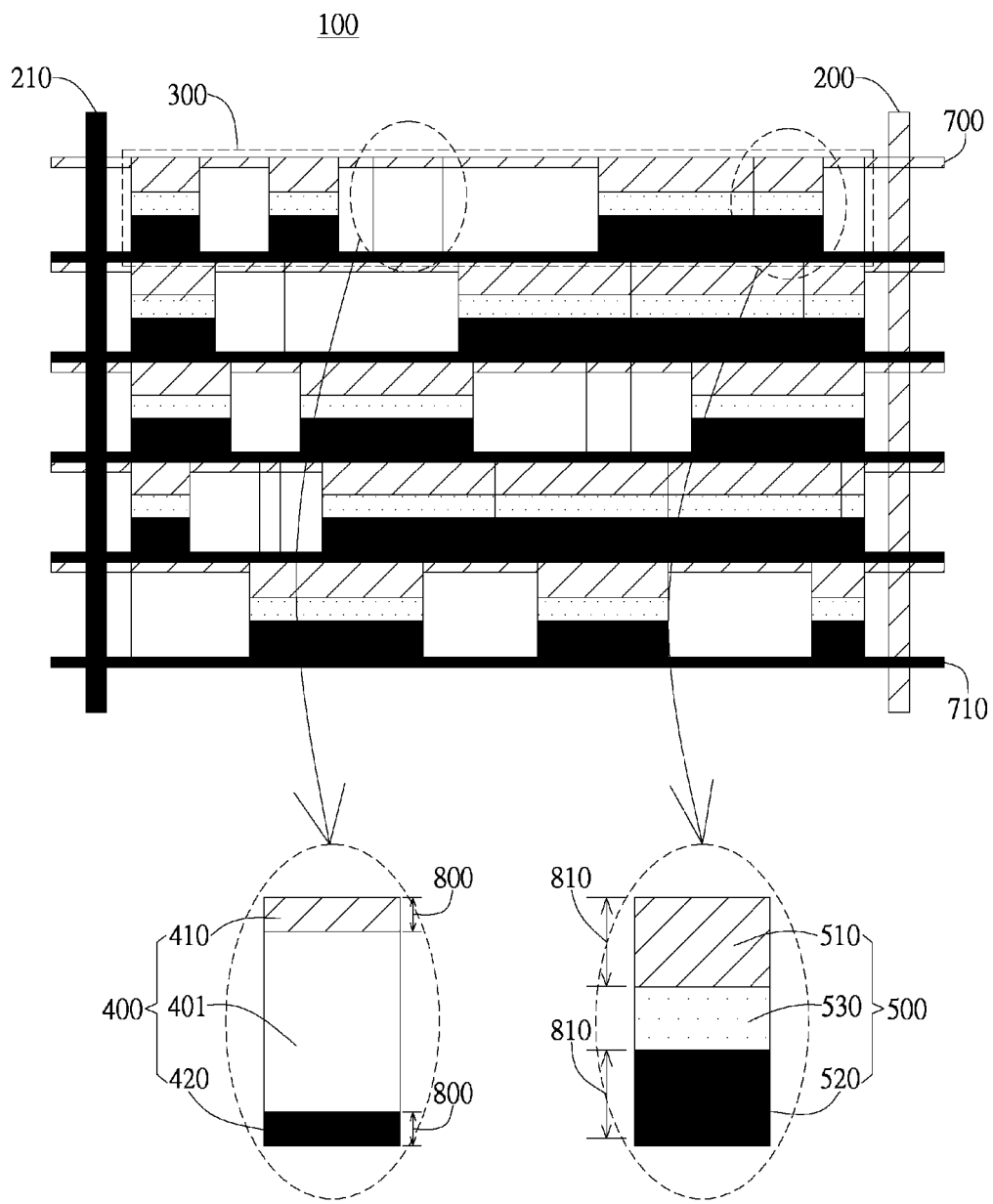
FIG. 2 is a schematic view of the digital logic circuit of the present invention.

FIG. 2 is a schematic view of the digital logic circuit 100 of the present invention. The digital logic circuit 100 includes a voltage rail 200, a ground rail 210, and a plurality of logic circuit rails 300, wherein the logic circuit rails 300 are located next to each other between the voltage rail 200 and the ground rail 210, i.e. the logic circuit rails 300 are distributed in a direction perpendicular to the voltage rail 200 or the ground rail 210. Furthermore, the logic circuit rail 300 of the present embodiment includes a plurality of logic units 400 and a plurality of auxiliary units 500, wherein the logic units 400 and the auxiliary units 500 have different sizes and are arranged in a direction vertical to the voltage rail 200 and the ground rail 210 to form the logic circuit rail 300. That is, the logic units 400 and the auxiliary units 500 are disposed along the direction vertical to the ground rail 210 or the voltage rail 200. In the present embodiment, the logic unit 400 includes a transistor region 401 including a plurality of electrically connected transistors, wherein each of the logic units 400 is either a device for providing a Boolean function (such as AND gates, OR gates, NOT gates, NAND gates, NOR gates, or XOR gates) or a data storage element such as a flip-flop or a latch. In the present embodiment, the logic units 400 can be the same width, but have different dimensions based on the number of transistors used and the connections between the transistors. In other embodiments, the logic units 400 can be the same size, but have different functions. In other words, the size of the logic unit 400 and the function of the logic unit 400 have no direct relationship.

In the embodiment illustrated in FIG. 2, each of the logic units 400 is arranged at a specific location between the voltage rail 200 and the ground rail 210 based on corresponding performance requirements (such as power consumption) and the circuitry design by the electronic design automation software. The logic units 400 of the logic circuit rail 300 of the present embodiment may not occupy all the space between the voltage rail 200 and the ground rail 210 due to the limitation of space, wiring, or other factors and thus there will be gaps between logic units 400. The auxiliary unit 500 is disposed in the space between adjacent logic units 400 to electrically connect the logic units 400 with the voltage rail 200 and the ground rail 210. The logic unit 400 has a metal connection layer (not illustrated) used to connect the transistors within the logic units 400, wherein the logic unit 400 of the present embodiment has only one metal connection layer, but is not limited thereto; in different embodiments, the logic unit 400 can have other numbers of metal connection layers based on performance requirements and connections between transistors within the logic units 400.

In the enlarged view of FIG. 2, the logic unit 400 includes a logic voltage end 410 electrically connected to the voltage rail 200 and a logic ground end 420 electrically connected to the ground rail 210. The auxiliary unit 500 includes an auxiliary voltage end 510 and an auxiliary ground end 520. The adjacent logic voltage end 410 and the auxiliary voltage end 510 are electrically connected to each other and further to the voltage rail 200 on one side of the logic circuit rail 300. In other words, the logic voltage ends 410 and the auxiliary voltage ends 510 are connected in series to form a voltage conductor bar 700. Similarly, the adjacent logic ground end 420 and the auxiliary ground end 520 are electrically connected to each other and further to the ground rail 210 on the other side of the logic circuit rail 300. In this way, the logic ground ends 420 and the auxiliary ground ends 520 are connected in series and form a ground conductor bar 710. This design allows all the logic units 400 to be electrically connected to the voltage rail 200 and the ground 210 to receive electrical power.

Furthermore, in the present embodiment, the auxiliary voltage end 510 and the corresponding auxiliary ground end 520 are not electrically connected. In other words, a blank region 530 exists between the auxiliary voltage end 510 and the auxiliary ground end 520. In the present embodiment, the ratio between the second width of the auxiliary voltage end 510 and the width of the blank region 530 or the ratio between the second width 810 of the auxiliary ground end 520 and the width of the blank region 530 is preferably 2.5, but is not limited thereto; in different embodiments, the width ratio between the blank region 530 and the auxiliary voltage end 510 or between the blank region 530 and the auxiliary ground end 520 can be adjusted based on circuitry design or the desired overall resistance of the logic circuit rail 300.

As FIG. 2 shows, all the logic voltage ends 410 have a first width 800, wherein the second width 810 of the auxiliary voltage end 510 is greater than the first width 800 of the logic voltage end 410. In other words, the width ratio between the auxiliary voltage end 510 and the logic voltage end 410 is greater than 1. Furthermore, the second width 810 of the auxiliary ground end 520 is greater than the first width 800 of the logic ground end 420 and therefore the width ratio between the auxiliary ground end 520 and the logic ground end 420 is greater than 1. The increase in the second width 810 of the auxiliary voltage end 510 increases the cross-sectional area of the auxiliary voltage end 510 and in turn reduces the overall resistance of the auxiliary voltage end 510. Consequently, the overall resistance of the voltage conductor bar 700 formed by the logic voltage end 410 and the auxiliary voltage end 510 is reduced. Similarly, the increase in the second width 810 of the of the auxiliary ground end 520 increases the cross-sectional area of the auxiliary ground end 520 and in turn reduces the overall resistance of the auxiliary ground end 520 as well as the overall resistance of the ground conductor bar 710. Furthermore, the voltage conductor bar 700 and the ground conductor bar 710 are parts of the logic circuit rail 300. The decreases in resistance of the voltage conductor bar 700 and the ground conductor bar 710 therefore decreases the overall resistance of the logic circuit rail 300, reduces the overall response time of the logic circuit rail 300, and improves the computing efficiency of the digital logic circuit 100. Furthermore, in the present embodiment, the auxiliary voltage end 510 and the auxiliary ground end 520 have the same second width 810, but are not limited thereto; in different embodiments, the auxiliary voltage end 510 and the auxiliary ground end 520 can have different widths according to the desired overall resistance of the digital logic circuit 100.

Figure 3:
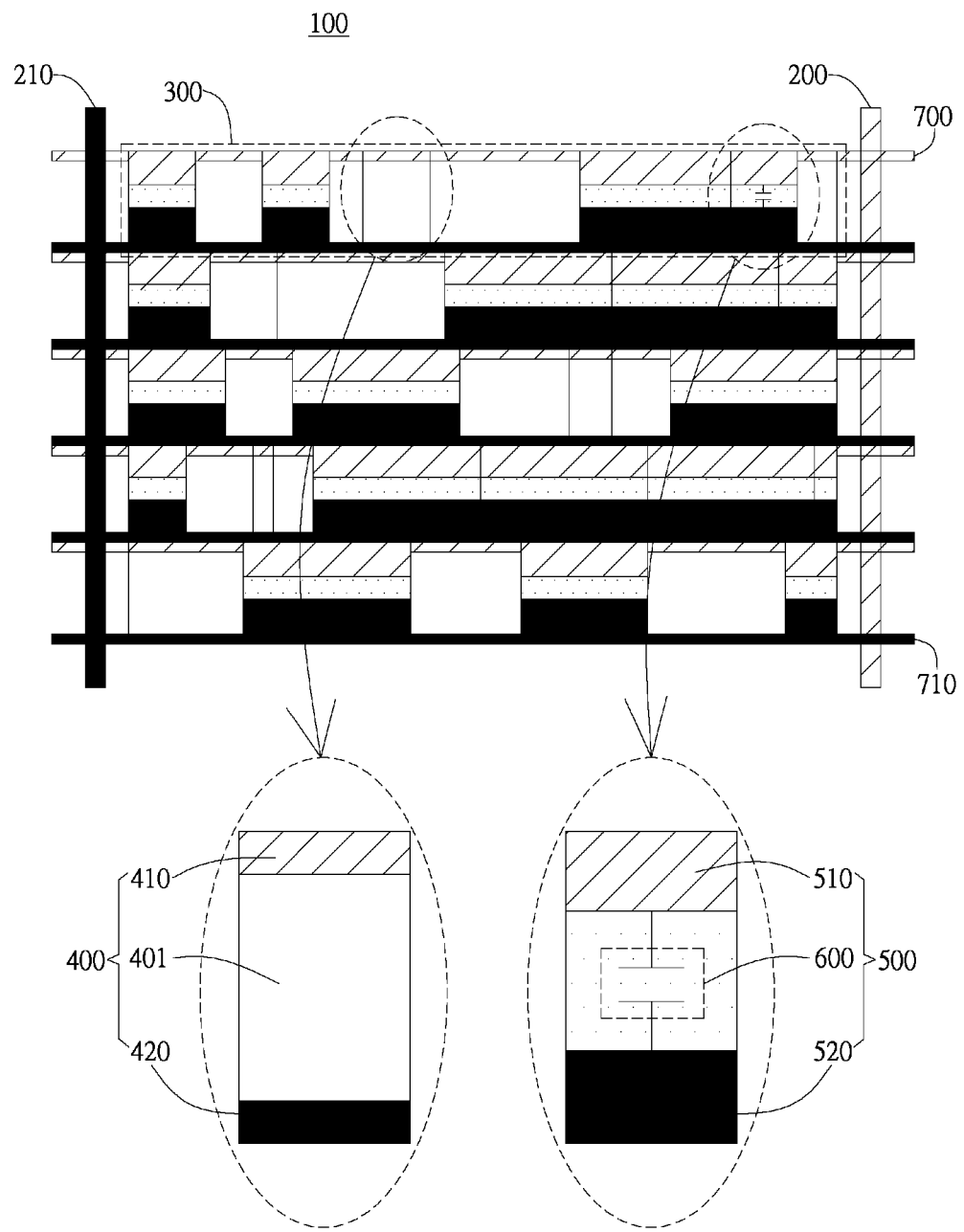
FIG. 3 is a schematic view illustrating a variation of the digital logic circuit illustrated in FIG. 2.

FIG. 3 is a schematic view illustrating a variation of the digital logic circuit 100 illustrated in FIG. 2. As FIG. 3 shows, the auxiliary unit 500 further includes a capacitor 600 disposed between the auxiliary voltage end 510 and the auxiliary ground end 520. In the present embodiment, the electric power or signals flowing through the voltage rail 200, the digital logic circuit 100, and the ground rail 210 may contain electrical noise signals and the capacitor 600 is used to filter out the electrical noise signals contained in the electric power or signals to reduce the interference to the digital logic circuit 100. In the present embodiment, the capacitor 600 is a metal-oxide-silicon (MOS) capacitor, but is not limited thereto. In different embodiments, the capacitor 600 can include other types of capacitors. Furthermore, the widths of the auxiliary voltage end 510 and the auxiliary ground end 520 can be adjusted based on the size of the capacitor 600 and therefore not limited to the embodiment illustrated in FIG. 3.

Figure 4:
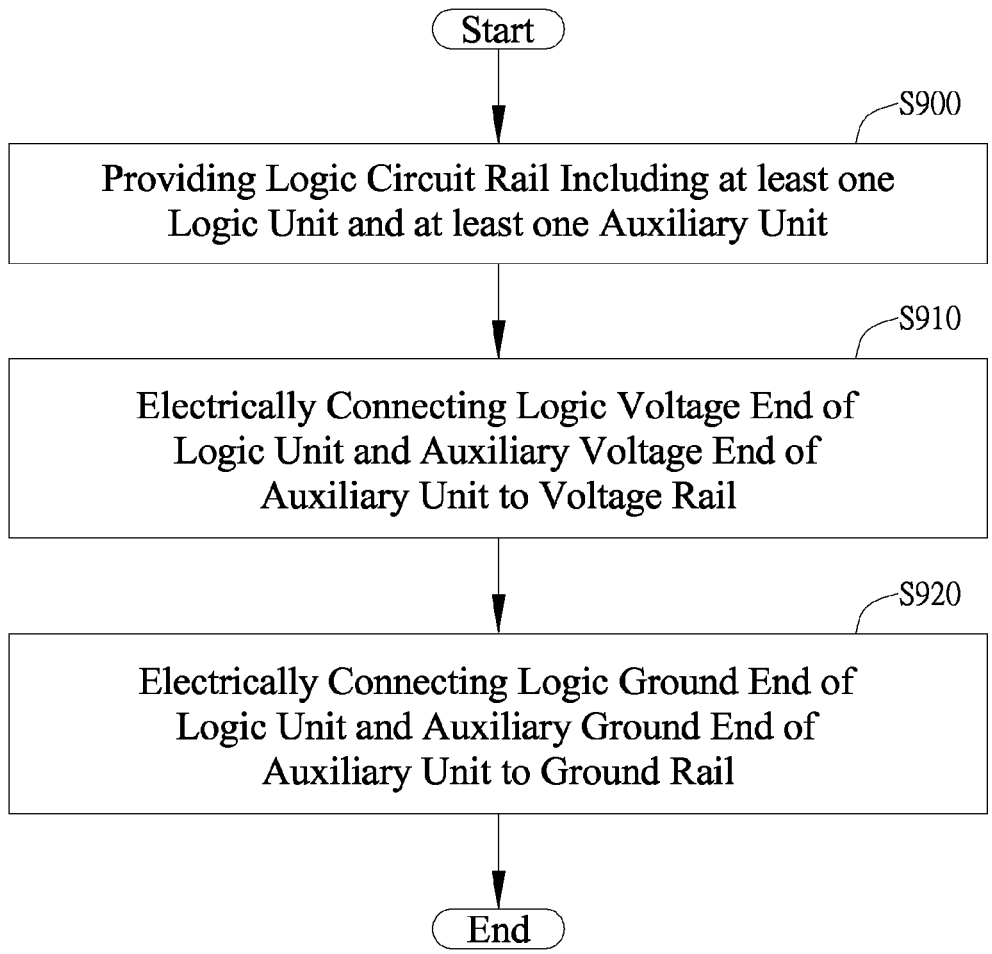
FIG. 4 is a flowchart illustrating the manufacture method of the digital logic circuit of the present invention.

FIG. 4 is a flow chart illustrating a method of manufacturing a digital logic circuit of the present invention. As FIG. 4 shows, the method includes step S900 of providing a logic circuit rail including at least one logic unit and at least one auxiliary unit. In the present embodiment, two ends of the logic circuit rail are connected to a voltage rail and a ground rail respectively to obtain electrical signals. The logic units included in the logic circuit rail are configured to perform specific logic functions such as AND, OR, NOT, NAND, NOR, XOR, wherein each specific logic function can be realized in different ways. For instance, the logic units for performing the AND function can have different sizes or areas due to the difference in connections between transistors or the number of the transistors used. Furthermore, the logic circuit rail of the present embodiment has a fixed length; however, the logic circuit rail may not consist entirely of logic units due to circuitry design of the electronic design automation (EDA) software. Therefore, a portion of the logic units are not connected to the voltage rail and the ground rail due to the gaps exists between the logic units and cannot acquire electrical signals from the voltage rail and the ground rail.

The auxiliary units of the present embodiment are configured to fill the gaps between logic units and connect all the logic units to the voltage rail and the ground rail. As FIG. 4 shows, the method further includes step S910 of electrically connecting a logic voltage end of the logic unit and an auxiliary voltage end of the auxiliary unit to the voltage rail. The method also includes step S920 of electrically connecting a logic ground end of the logic unit and an auxiliary ground end of the auxiliary unit to the ground rail. In the present embodiment, the logic voltage end and the auxiliary voltage end are connected in series to form a voltage conductor bar while the voltage ground end and the auxiliary ground end are connected in series to form a ground conductor bar. The logic units are connected to the voltage rail via the voltage conductor bar and to the ground rail via the ground conductor bar to establish an electric loop for acquiring electrical signals.

In the present embodiment, a second width of the auxiliary voltage end is greater than a first width of the logic voltage end. Compared with the conventional voltage conductor bar with a uniform width, the voltage conductor bar of the present invention has a greater cross-sectional area and therefore has reduced overall resistance. Similarly, the second width of the auxiliary ground end is greater than a first width of the logic ground end. In this way, compared with the conventional ground conductor bar, the ground conductor bar of the present invention has a greater cross-sectional area and thus a reduced overall resistance. This shows that the overall resistance of the logic circuit rail can be reduced by increasing the widths of the auxiliary voltage end and the auxiliary ground end. In this way, the logic circuit rail can have a reduced response time and higher computing efficiency.

Figure 5:
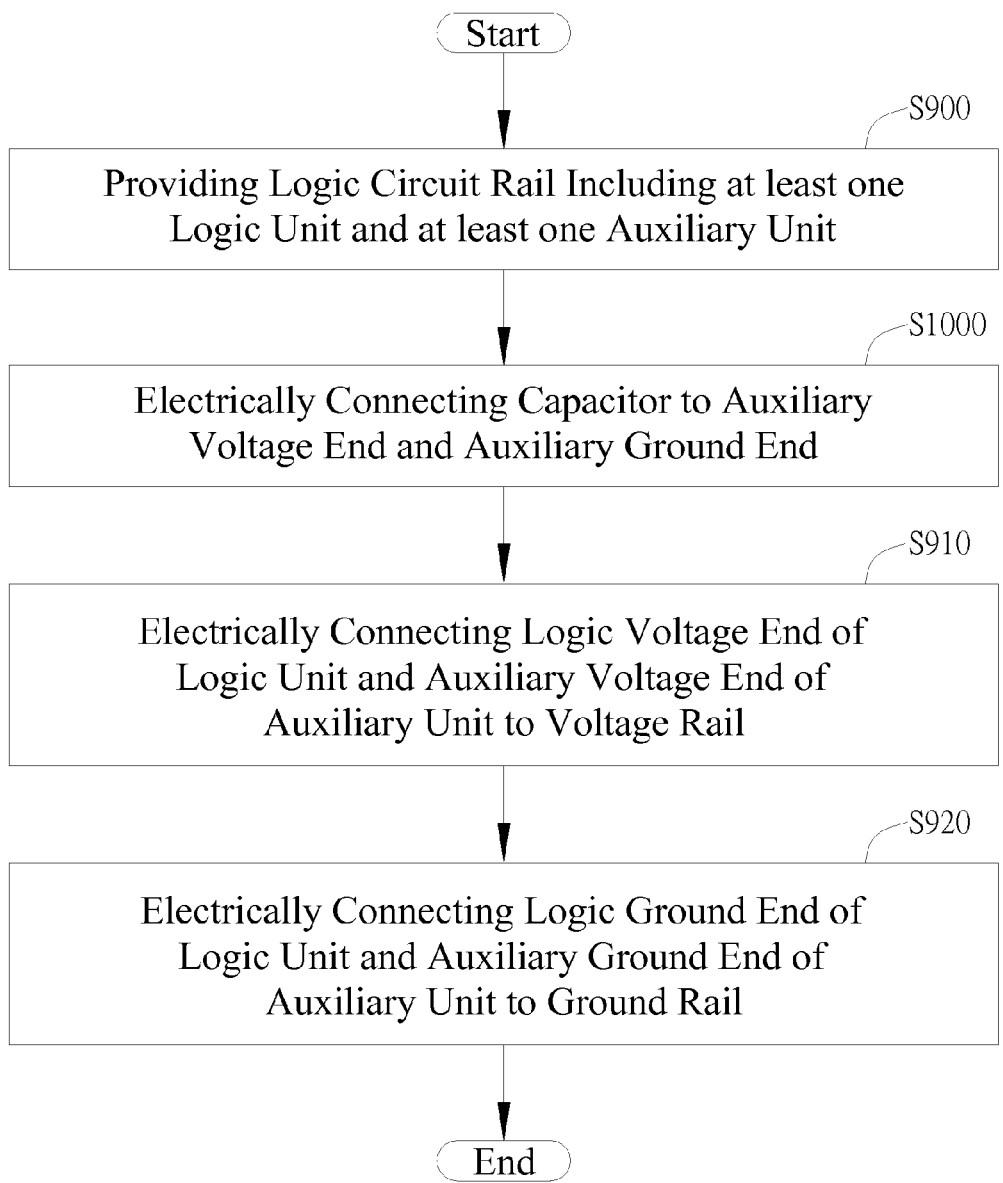
FIG. 5 is a flowchart illustrating a variation of the manufacture method illustrated in FIG. 4.

Furthermore, the auxiliary voltage end and the auxiliary ground end of the present embodiment have a blank region for electrically isolating the auxiliary voltage end from the auxiliary ground end, but is not limited thereto. In the embodiment illustrated in FIG. 5, the method further includes step S1000 of electrically connecting a capacitor to the auxiliary voltage end and the auxiliary ground end. In the embodiment illustrated in FIG. 5, the capacitor is used to filter out the electrical noise signal within the logic circuit rail, but is not limited thereto.

The above is detailed descriptions of the particular embodiments of the invention which is not intended to limit the invention to the embodiments described. It is recognized that modifications within the scope of the invention will occur to a person skilled in the art. Such modifications and equivalents of the invention are intended for inclusion within the scope of this invention.

What is claimed is:

1. A digital logic circuit, comprising:
a voltage rail;
a ground rail; and
a plurality of logic circuit rails, wherein each of the logic circuit rails is electrically connected to the voltage rail and the ground rail, the logic circuit rail includes:
at least one logic unit, wherein the logic unit includes a logic voltage end electrically connected to the voltage rail and a logic ground end electrically connected to the ground rail; and
at least one auxiliary unit, wherein the auxiliary unit includes an auxiliary voltage end electrically connected to the voltage rail and an auxiliary ground end electrically connected to the ground rail;
wherein the logic unit and the auxiliary unit have the same width and are arranged in series, a first width of the auxiliary voltage end is larger than a second width of the logic voltage end and/or a third width of the auxiliary ground end is larger than a fourth width of the logic ground end.

2. The digital logic circuit of claim 1, wherein the auxiliary unit further includes a blank region located between the auxiliary voltage end and the auxiliary ground end.

3. The digital logic circuit of claim 1, wherein the auxiliary voltage end and the auxiliary ground end have different widths.

4. The digital logic circuit of claim 1, wherein the auxiliary unit includes a capacitor disposed between the auxiliary voltage end and the auxiliary ground end, the capacitor is electrically connected to the auxiliary voltage end and the auxiliary ground end.

5. A method of manufacturing a digital logic circuit, comprising steps of:
providing a logic circuit rail including at least one logic unit and at least one auxiliary unit;
electrically connecting a logic voltage end of the logic unit and an auxiliary voltage end of the auxiliary unit to a voltage rail; and
electrically connecting a logic ground end of the logic unit and an auxiliary ground end of the auxiliary unit to a ground rail;
wherein the logic unit and the auxiliary unit have the same width, a first width of the auxiliary voltage end is larger than a second width of the logic voltage end and/or a third width of the auxiliary ground end is larger than a fourth width of the logic ground end.

6. The method of claim 5, further including forming a blank region between the auxiliary voltage and the auxiliary ground end.

7. The method of claim 5, further including electrically connecting a capacitor to the auxiliary voltage end and the auxiliary ground end.

* * * * *